(12) United States Patent
Mann et al.

(10) Patent No.: US 12,444,869 B2
(45) Date of Patent: Oct. 14, 2025

(54) COPLANAR CARD-EDGE CONNECTOR

(71) Applicant: INTERNATIONAL BUSINESS MACHINES CORPORATION, Armonk, NY (US)

(72) Inventors: Phillip V. Mann, Rochester, MN (US); Tyler Smith, Rochester, MN (US); Tyler Jandt, Austin, TX (US); Sandra J. Shirk/Heath, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 18/080,967

(22) Filed: Dec. 14, 2022

(65) Prior Publication Data
US 2024/0204434 A1   Jun. 20, 2024

(51) Int. Cl.
*H01R 12/72* (2011.01)
*H01R 12/73* (2011.01)
*H05K 1/11* (2006.01)

(52) U.S. Cl.
CPC ......... *H01R 12/721* (2013.01); *H01R 12/724* (2013.01); *H01R 12/735* (2013.01); *H05K 1/117* (2013.01); *H05K 2201/10189* (2013.01); *H05K 2201/10325* (2013.01)

(58) Field of Classification Search
CPC .. H01R 12/721; H01R 12/724; H01R 12/735; H05K 1/117; H05K 2201/10325; H05K 2201/10189
USPC .......................................... 439/61, 62, 65, 79
See application file for complete search history.

(56) References Cited

U.S. PATENT DOCUMENTS

| | | | |
|---|---|---|---|
| 5,010,446 A | 4/1991 | Scannell | |
| 5,184,961 A * | 2/1993 | Ramirez | H01R 13/518 |
| | | | 439/328 |
| 5,511,985 A * | 4/1996 | Noschese | H01R 12/7005 |
| | | | 439/157 |
| 6,280,201 B1 | 8/2001 | Morris | |
| 7,104,809 B1 * | 9/2006 | Huang | H01R 31/06 |
| | | | 439/142 |
| 7,186,145 B1 * | 3/2007 | Feldman | H01R 12/73 |
| | | | 361/738 |
| 7,361,043 B2 | 4/2008 | Takahashi | |

(Continued)

FOREIGN PATENT DOCUMENTS

| | | | |
|---|---|---|---|
| CN | 101950864 A | 1/2011 | |
| CN | 107331995 A | 11/2017 | |
| EP | 3032427 A1 * | 6/2016 | ............... G06F 1/16 |

*Primary Examiner* — Gary F Paumen
(74) *Attorney, Agent, or Firm* — James L. Olsen

(57) ABSTRACT

A connection system comprises a printed circuit board. The printed circuit board comprises a top face and a bottom face. The printed circuit board also comprises a first edge that is normal to the top face and bottom face. The printed circuit board also comprises a second edge that is normal to the top face and bottom face. The first edge face and second edge face intersect at an angle that is not a straight angle. The connection system also comprises a coplanar card-edge socket on the printed circuit board. The socket comprises a top section that interfaces with the top face of the printed circuit board along the first and second edge faces of the printed circuit board. The socked also comprises a bottom section that interfaces with the bottom face of the printed circuit board along the first and second edge faces of the printed circuit board.

18 Claims, 7 Drawing Sheets

(56) References Cited

U.S. PATENT DOCUMENTS

| | | | |
|---|---|---|---|
| 8,118,600 B2 | 2/2012 | Miki et al. | |
| 9,832,876 B2 | 11/2017 | Prakash et al. | |
| 10,020,603 B1 | 7/2018 | Liu et al. | |
| 10,263,352 B2 | 4/2019 | Smith, Jr. et al. | |
| 2007/0184722 A1* | 8/2007 | Doherty | A63H 33/042 |
| | | | 439/638 |
| 2009/0021921 A1* | 1/2009 | Jang | H05K 1/117 |
| | | | 361/752 |
| 2009/0104818 A1* | 4/2009 | Wu | H01R 12/716 |
| | | | 439/638 |
| 2011/0235963 A1 | 9/2011 | Benzoni | |
| 2016/0028173 A1* | 1/2016 | Bosscher | H05K 3/36 |
| | | | 29/830 |
| 2022/0294137 A1* | 9/2022 | Lin | H01R 33/90 |

* cited by examiner

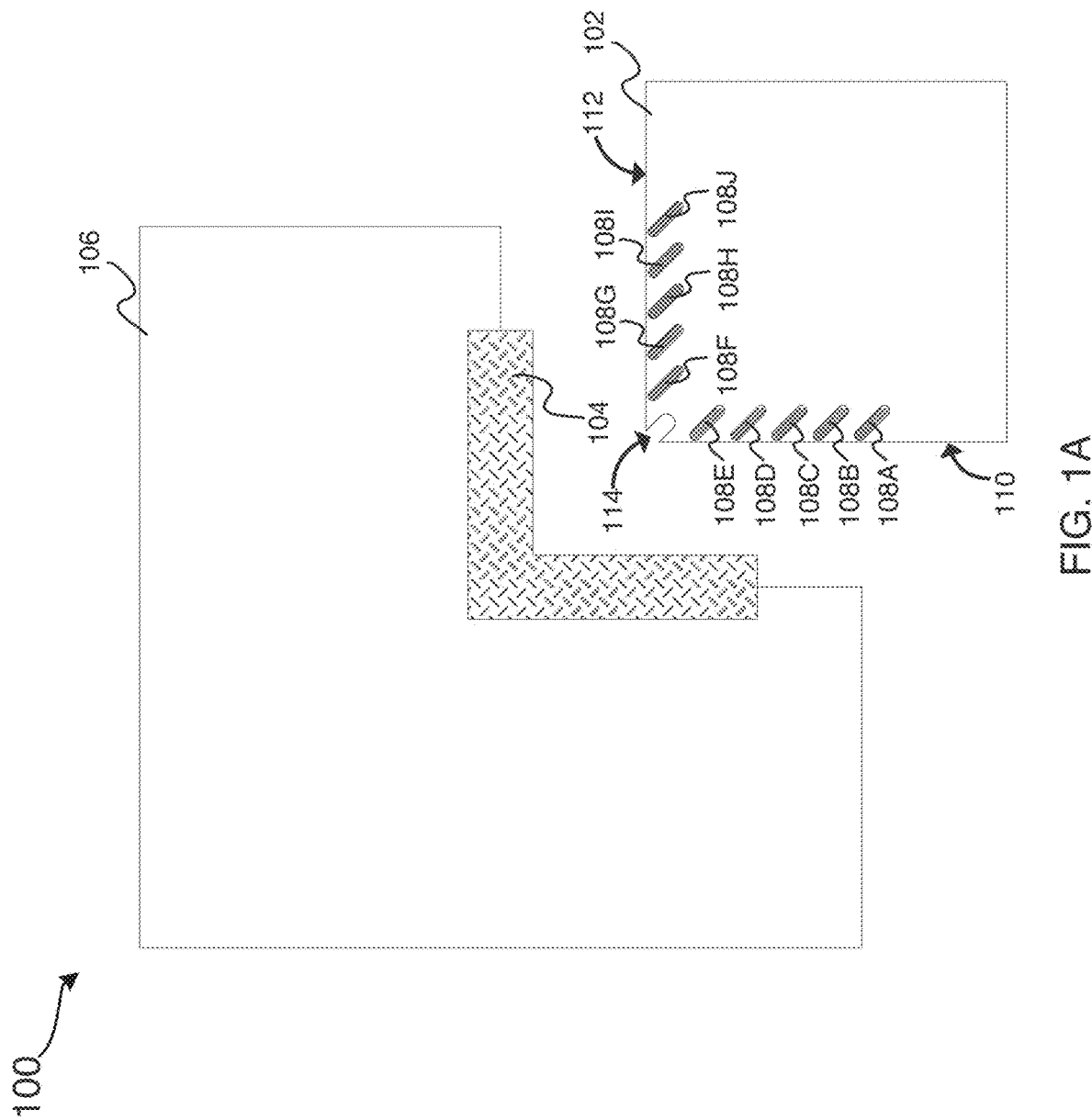

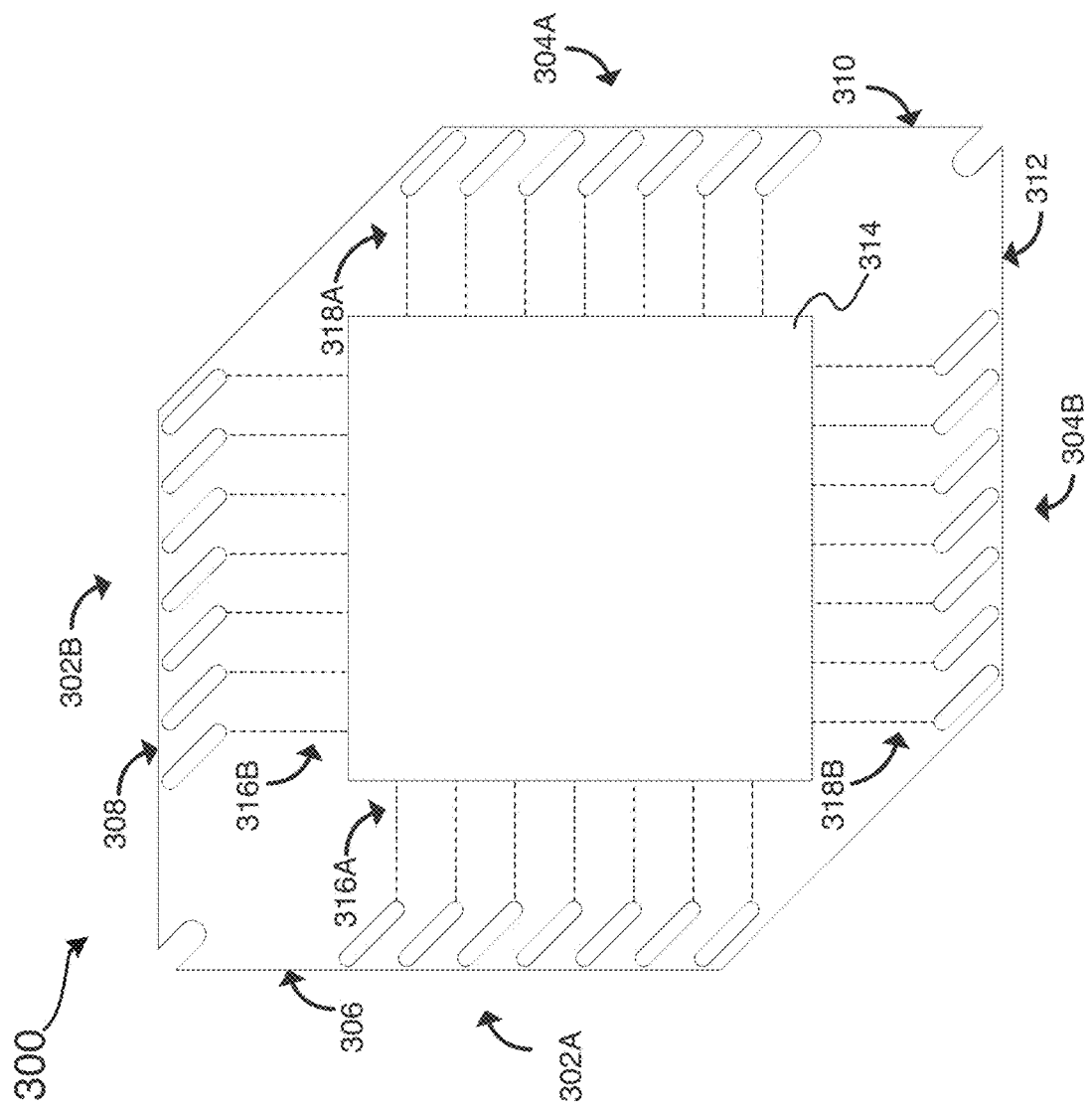

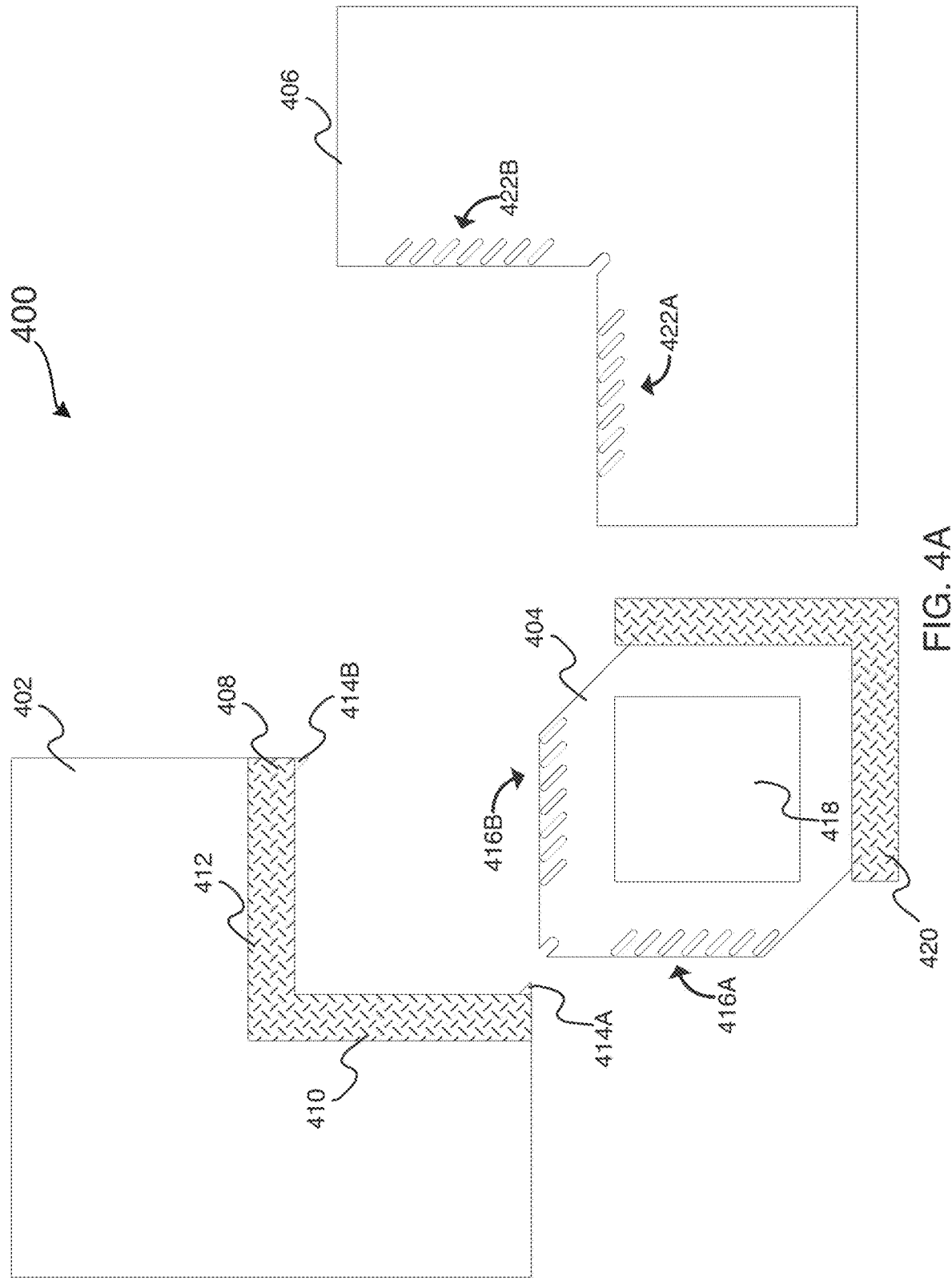

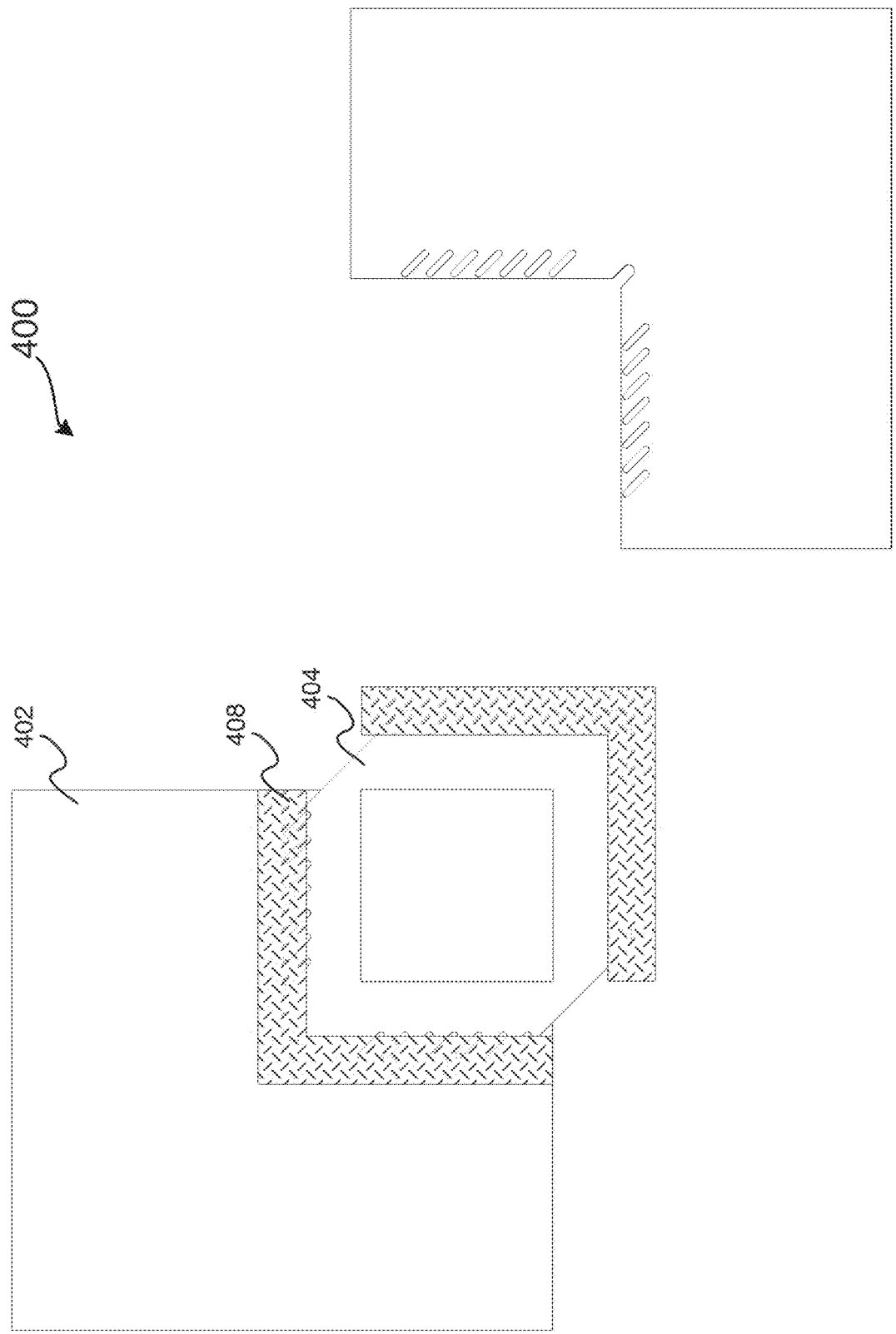

COPLANAR CARD-EDGE CONNECTOR

BACKGROUND

The present invention relates to card-edge connectors, and more specifically, to card-edge connectors in environments with limited installment space.

A card-edge connector is a connection type between a circuit board and a discrete component. This discrete component may take the form of a socket mounted on a second circuit board, in which case the card-edge connector can be utilized as a connection between the circuit board and second circuit board. In a typical card-edge connector, contact traces (sometimes referred to herein as "card-edge contacts") are placed directly on one or both sides of a circuit board near or at the edge of the circuit board. A corresponding socket may contain a circuit-board shaped opening (sometimes referred to herein as a "slot") and contacts therein that may interface with the contact traces when the edge of the circuit board is inserted into the slot.

SUMMARY

Some embodiments of the present disclosure can be illustrated as a connection system for a card-edge connector. The connection system comprises a printed circuit board. The printed circuit board comprises a top face and a bottom face. The printed circuit board also comprises a first edge face that is normal to the top face and bottom face and a second edge face that is normal to the top face and bottom face. The first edge and second edge intersect at an angle that is not a straight angle. The connection system also comprises a coplanar card-edge socket on the printed circuit board. The socket comprises a top section that interfaces with the top face of the printed circuit board along the first and second edge faces of the printed circuit board. The socket also comprises a bottom section that interfaces with the bottom face of the printed circuit board along eth first and second edge faces of the printed circuit board.

Some embodiments of the present disclosure can also be illustrated as a printed circuit board. The printed circuit board comprises a top face and a bottom face. The printed circuit board also comprises a first edge face that is normal to the top face and the bottom face and a second edge face that is normal to the top face and bottom face. The first edge face and second edge face intersect at an angle that is not a straight angle. The printed circuit board also comprises a first set of card-edge contacts on the top face along the first edge face and a second set of card-edge contacts on the top face along the second edge face. The printed circuit board also comprises a circuit-chip module mounted to the top face of the printed circuit board. The circuit-chip module is partially surrounded by the first set of card-edge contacts and second set of card-edge contacts.

Some embodiments of the present disclosure can also be illustrated as a connection system for a card-edge connector. The connection system comprises a first printed circuit board. The first printed circuit board comprises a first top face and a first bottom face. The first printed circuit board also comprises a first edge that is normal to the first top face and first bottom face. The first printed circuit board also comprises a second edge that is normal to the first top face and first bottom face. The first edge and second edge intersect at a first angle that is not a straight angle. The connection system also comprises a second printed circuit board. The second printed circuit board comprises a second top face and a second bottom face. The second printed circuit board also comprises a third edge that is normal to the second top face and second bottom face. The second printed circuit board also comprises a fourth edge that is normal to the second top face and second bottom face. The third edge and fourth edge intersect at an angle that is supplementary to the first angle. The second printed circuit board also comprises a first set of card-edge contacts on the second top face along the third edge. The connection system also comprises a coplanar card-edge socket on the first printed circuit board. The socket comprises a top section that interfaces with the first top face of the first printed circuit board along the first and second edges of the first printed circuit board. The socket also comprises a bottom section that interfaces with the first bottom face of the first printed circuit board along the first and second edges of the first printed circuit board. Inserting the third and fourth edges of the second printed circuit board into the coplanar card-edge socket causes the first printed circuit board to be on the same plane as the second printed circuit board.

BRIEF DESCRIPTION OF THE DRAWINGS

FIG. 1A discloses a connection system for a card-edge connector prior to a printed circuit board being inserted into a coplanar card-edge socket.

FIG. 3 discloses a printed circuit board with card-edge contacts on four edges of the printed circuit board and a module between the card-edge contacts.

FIG. 4A discloses a connection system for a set of card-edge connectors with three printed circuit boards.

FIG. 4B discloses the connection system after a first printed circuit board is inserted into a coplanar card-edge socket on a second printed circuit board.

DETAILED DESCRIPTION

Figure 1B:
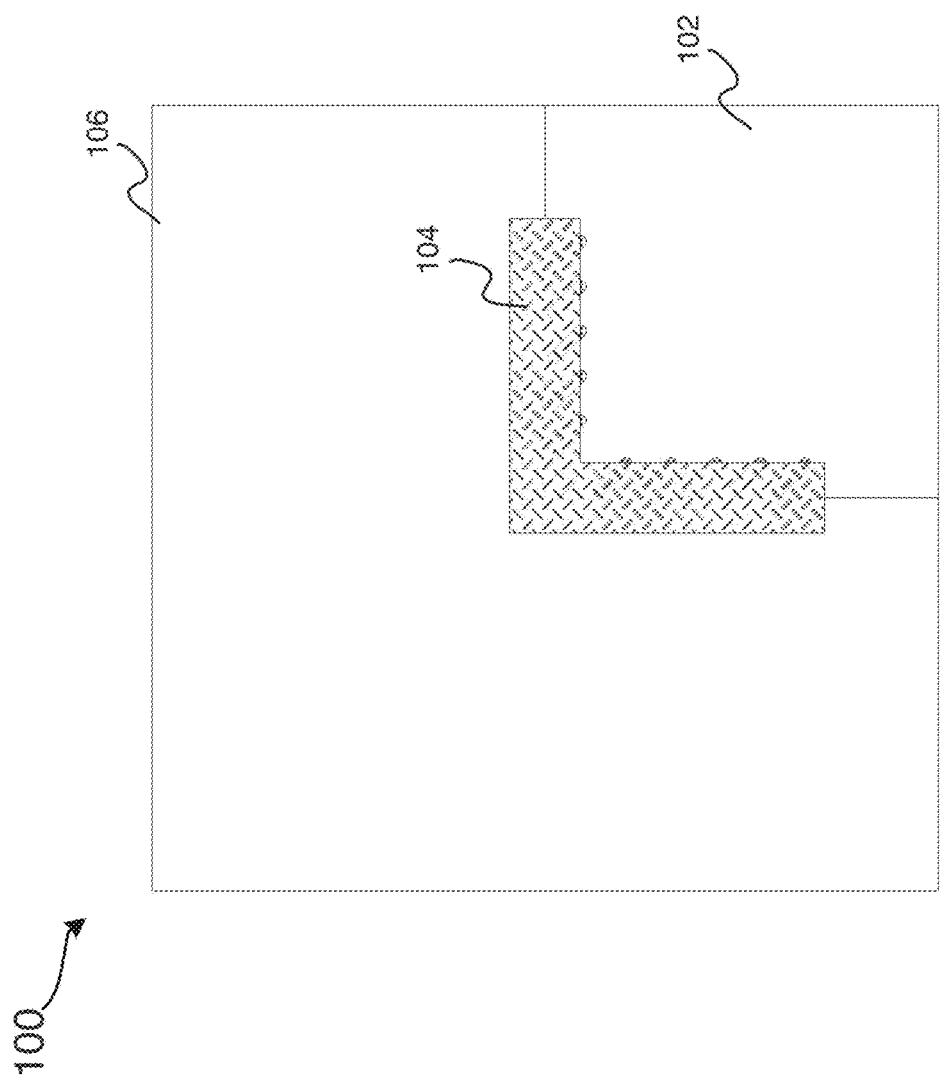
FIG. 1B discloses the connection system for a card-edge connector after the printed circuit board is inserted into the coplanar card-edge socket.

Aspects of the present disclosure relate to electrical-connector sockets, more particular aspects relate to card-edge connector sockets. While the present disclosure is not necessarily limited to such applications, various aspects of the disclosure may be appreciated through a discussion of various examples using this context.

Typical card-edge connectors take the form of trace contacts (sometimes referred to herein as "card-edge contacts") placed on the surface of a printed circuit board (sometimes referred to herein as a "PCB") that is designed to be inserted into a PCB-shaped slot in a socket. The socket typically contains contacts (sometime in the form of contact pins) that interface with the trace contacts when the PCB is inserted into the slot.

Because a card-edge connector enables a PCB itself to be inserted directly into a connector, card-edge connectors can provide efficient means to connect the components of that PCB to other components of a larger system. For example, in some embodiments, a connection system for a card-edge connector may enable a first PCB to be inserted directly into a socket that extends directly from a second PCB. This enables a connection between the components of both PCBs without reliance on any connectors (e.g., cables) that are external to either PCB.

However, some connection systems for card-edge connectors place limitations on the designs of the circuit boards in and on which those connectors are incorporated. Because the typical card-edge contacts on a PCB are designed as a series of spaced-apart metal traces at an edge of a PCB surface, a card-edge connector that requires a large number of connectors sometimes also requires a long span (i.e., length) of the PCB to be dedicated to the series of traces. For example, the relatively large width of a typical consumer-grade read-only-memory ("RAM") module is largely dictated not by the amount of memory carried by that RAM circuit chips, but rather by (1) the width that is required to lay out the metal traces to connect those chips to the overall system and (2) the wiring throughout the RAM module PCB that is required to connect the chips to those metal traces.

In some use cases, even if the area on the edge of a card for the card-edge contacts would not place undesirable restrictions on the design of a PCB per se, the wiring from those connections to a component on the PCB may result in undesirable design restrictions. For example, some circuit-chip modules, such as memory modules and microchip processors require the length of each wire between the chip and each card-edge contact to be of similar, if not identical, length. This is due to the chip requiring each signal sent on one of those wires to reach each card-edge contact at the same time. This can become difficult if a chip connects to many card-edge contacts that are spread across an edge of a PCB, as the wiring between the closest card-edge contact and the chip may be significantly shorter than the wiring between the farthest card-edge contact and the chip. In some such situations, extra PCB space is designed to allow the wiring between a closest card-edge contact and the chip to take a far more circuitous route than the wiring between the farthest card-edge contact and the chip. This circuitous route may artificially lengthen the wiring to equal the wiring of other card-edge contacts, but may also require a very large amount of PCB space.

In some use cases, card-edge connectors can also result in design constraints not only on the PCBs that hold the connectors (i.e., the card-edge contacts and the corresponding card-edge socket), but also on the overall system. For example, some connection systems for card-edge connectors involve a first PCB with card-edge contacts to be plugged into a socket that extends from the surface of a second PCB, resulting in the first PCB (sometimes referred to as the "daughterboard") extending perpendicular from the second PCB. In other words, the bottom and top surface of the first PCB are perpendicular to the bottom and top surface of the second PCB. As a result, the system into which the connection system is installed must be large enough to accommodate the width and depth of the first PCB in a first plane and the width and depth of the second PCB in the second plane.

Some connection systems for card-edge connectors attempt to mitigate the overall system space required for the connectors by stacking the connected PCBs on top of each other. In other words, a first PCB may be inserted into a socket on a second PCB in a way that results in the first PCB being parallel to, but above the second PCB. For example, some low-profile RAM modules in laptop computers utilize these or similar connection-system designs. However, while such designs do reduce the amount of space above the second PCB that is required to support the first PCB, such designs typically also place restrictions on the design of the second PCB. This is because the first PCB is typically stacked on top of and close to the second PCB, and thus the area on the second PCB that is beneath the first PCB cannot be used for components that would be tall enough to contact the first PCB. In other words, width and depth of the first PCB must be effectively reserved on the surface of the second PCB almost as if the first PCB were designed into the second PCB.

All of the above issues with card-edge connectors are mitigated in use cases that require a large number of card-edge contacts or a large daughter-board PCB. For example, connections that require very high bandwidth or connectors for a high number of microprocessor pins may require a significant length of a card edge to be reserved for card-edge contacts and may also require a significant amount of PCB space to be dedicated to wiring for those contacts. Further, large daughterboards such as pluggable VRM boards may not only require a large number of contacts, but may themselves have large PCBs to hold the necessary power stages.

The above issues can sometimes limit the environments in which card-edge connectors can be used. Further, even when card-edge connectors can be used in a particular environment, the benefits derived from them may be reduced or mitigated by the space necessary to support them. For example, environments in which multiple servers are installed in small spaces are often very space limited but also require high, reliable power and high bandwidth. More space-efficient card-edge connector systems may increase the benefit of card-edge connectors derived by those systems.

Some embodiments of the present disclosure address the above issues by incorporating card-edge contacts on multiple adjacent edges of a PCB. For example, rather than lining all card-edge contacts on a single edge of a PCB, which requires the overall design of the PCB to incorporate at least one edge long enough for all those contacts, some embodiments of the present disclosure distribute the contacts for a single connector at a corner of the PCB across two edges of the PCB.

Further, some embodiments of the present disclosure utilize coplanar card-edge connector systems that enable a daughterboard to be plugged in to a socket in a mother board such that both PCBs are not only parallel, but also in plane with one another. In other words, the first PCB and second PCB are parallel, but neither PCB is on top of the other. In this way, the surface area of the daughterboard PCB does not need to be accounted for when selecting components to be placed on the surface of the motherboard PCB near the connector. Similarly, the daughterboard PCB can incorporate large components on both top and bottom faces without impacting the surface of the motherboard PCB.

Finally, some embodiments of the present disclosure position chips or other modules that connect to the card-edge traces in a way that reduces differences in length of the wires that connect the traces to the chips. For example, some embodiments of the present disclosure may position a chip near a card-edge connector that forms a 90-degree angle such that a line drawn between a set of contacts on one of the edges of the PCB and the module may intersect a line drawn between a set of contacts and on another edge of the PCB and the module at a right angle.

FIGS. 1A and 1B, for example, illustrate an example coplanar connection system 100 for a card-edge connector spaced across two edges of each of the corresponding printed circuit boards. FIG. 1A discloses a first printed circuit board 102 before being inserted into a coplanar card-edge socket 104 on a second printed circuit board 106.

First printed circuit board 102 (sometimes referred to herein as "PCB 102") contains 10 card-edge contacts 108A, 108B, 108C, 108D, 108E, 108F, 108G, 108H, 108I, and 108J (collectively, "108") that are distributed along two edges 110 and 112 of the top face of PCB 102. Specifically, card-edge contacts 108A-108E form a first set of card-edge contacts that is distributed along edge 110 and card-edge contacts 108F-108J form a first set of card-edge contacts that is distributed along edge 112. Of note, in practice card-edge contacts may often be distributed on both the top face and bottom face of a PCB. Thus, while only contacts on the top face of PCB 102 are visible in the view illustrated in FIG. 1A, PCB 102 may also include contacts on its bottom face.

Because contacts 108 are distributed along two edges 110 and 112, the overall surface area of first PCB 102 may be designed smaller. For example, it may not be possible to fit all of contacts 108 along either single edge 110 or 112 without making that edge longer. Making either edge longer, however, would also increase the overall surface area of first PCB 102, which may make it too large for the overall system or at least increase production costs.

Of note, edges 110 and 112 are shown at a right angle to one another, but in other embodiments other angles are possible. For example, edges 110 and 112 could be offset at an obtuse angle (i.e., an angle greater than 90 degrees but less than 180 degrees) an acute angle (i.e., angles less than 90 degrees), or a reflex angle (i.e., an angle greater than 180 degrees). Edges 110 and 112 could, in theory be offset at any angle that is neither a straight angle (i.e., 180 degrees) or no angle (i.e., 0 degrees). Of note, in some embodiments PCB 102 may also contain a matching number of card-edge contacts on the same two edges of the bottom face of PCB 102, but those are not illustrated in FIG. 1A.

Card-edge contacts 108 are oriented at an angle that matches the direction from which first PCB 102 is intended to be inserted into card-edge socket 104 on second PCB 106. Specifically, rather than being oriented perpendicularly to their respective edges, they are oriented at a 45-degree angle from their respective edges. For example, card-edge contact 108J is not oriented at a 90-degree angle from edge 112, but at a 45-degree angle from edge 112.

First PCB 102 also contains an alignment cutout 114. Alignment cutout 114 may match an alignment tab within socket 104 on PCB 106. The interaction between alignment cutout 114 and the corresponding alignment tab may not only assist in ensuring that first PCB 102 is inserted into socket 104 such that card-edge contacts 108 make proper connection with corresponding contacts within socket 104, but also may prevent first PCB 102 from shifting within socket 104.

For the purposes of understanding, FIG. 1B discloses connection system 100 after first PCB 102 is inserted into socket 104 on second PCB 106. Because card-edge contacts 108 were distributed over two edges (edges 110 and 112) of PCB 102 rather than a single edge, first PCB 102 was able to be shaped into a smaller footprint that corresponded to a cutout in second PCB 106. This may significantly decrease the total space required to support connection-system 100 on both of first PCB 102 and second PCB 106. Further, because connection system 110 is a coplanar design, first PCB 102 and second PCB 106 are parallel to and in the same plane as each other. This may also significantly reduce the overall space in the system that is required to support the combination of first PCB 102 and second PCB 106.

Of note, in practice it may be that some portions of PCB 102 are not exactly on the same plane as PCB 106 even though those PCBs are considered "coplanar" for the purposes of this disclosure. For example, in some use cases the top face of first PCB 102 may be parallel to and in the exact same plane as the top face of second PCB 106. This may occur, for example, if the opening in socket 104 is the same size as the width (i.e., thickness of PCB 106). However, in some use cases the top face of first PCB 102 may be in a slightly different plane than second PCB 106. This may occur, for example, if PCB 102 and PCB 106 are different thicknesses and if the opening in socket 104 is smaller or larger than the thickness of PCB 102. However, in these use cases the majority of the thicknesses of PCB 102 and 106 may still overlap and be within the same exact plane. Thus, the PCBs themselves are still considered to be on the same plane, and thus "coplanar" for the purpose of this disclosure.

Figure 2:
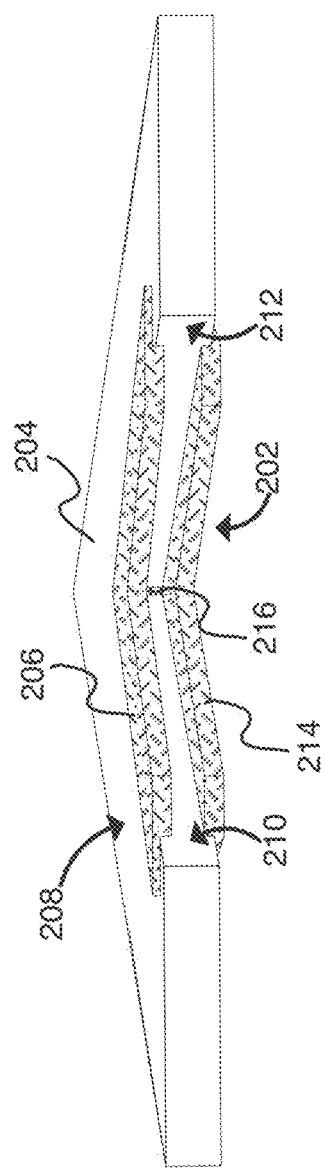
FIG. 2 discloses a coplanar card-edge socket on a printed circuit board.

For the sake of complete illustration, FIG. 2 discloses an example coplanar card-edge socket 202 on a printed circuit board 204. Socket 202 may be similar to, in some embodiments, socket 104 of FIGS. 1A and 1B.

Socket 202 contains a top section 206 that interfaces with the top face 208 of printed circuit board 204 (sometimes referred to herein as "PCB 204") along first edge 210 and second edge 212 of PCB 204. Top section 206 may be structurally bonded to top face 208, either of the edge faces along first edge 210 and second edge 212, or any combination thereof. Socket 202 also contains bottom section 214 that interfaces with a bottom face (not illustrated in FIG. 2) of PCB 204 along first edge 210 and second edge 212. Like top section 206, bottom section 214 may be structurally bonded to the bottom face, either of the edge faces along first edge 210 and second edge 212, or any combination thereof. While top section and bottom section are illustrated as physically separate components that together form socket 202, in some embodiments top section and bottom section may be physically connected to each other before or after being attached to PCB 204.

Socket 202 contains alignment tab 216, which may interact with an alignment cutout in a PCB that is inserted into socket 202. This alignment cutout may be similar to alignment cutout 114 of FIG. 1. The interaction between alignment tab 216 and this alignment cutout may prevent the PCB from shifting within socket 202. While not illustrated in FIG. 2, in some embodiments socket 202 may contain other structures designed to align, guide, and secure a PCB within socket 202. For example, the two ends of socket 202 that are furthest from alignment tab 216 may contain guides that are designed to encourage a PCB to be inserted into socket 202 in the correct position and orientation. These guides may also contain a locking mechanism that locks the PCB into socket 202 once fully inserted.

While also not illustrated in FIG. 2, socket 202 may also contain contacts on one or both of top section 206 and bottom section 214. These contacts may take various forms (e.g., pins, springs, traces) and may correspond to card-edge contacts on a PCB that is inserted into socket 202.

Because the opening of socket 202 is slightly narrower than the width of PCB 204, a PCB that is inserted into socket 202 would be slightly thinner than PCB 204. For this reason, while the two PCBs themselves would still be considered to be parallel and in the same plane, the top faces of the two PCBs would not be in the same exact plane. However, the PCBs would still be considered "coplanar" for the purposes of this disclosure.

On the other hand, in some embodiments the opening of socket 202 may be the same size as the thickness of PCB 204. In these embodiments, a PCB inserted into socket 202 may effectively be the same exact thickness as PCB 204.

Thus, in these embodiments, the top (and bottom) faces of the two PCBs may be within the same exact plane.

As noted above, some embodiments of the present disclosure include a module that is surrounded or partially surrounded by one or more card-edge connectors. This may reduce the difference in wire lengths between the card-edge contacts and the module, thus reducing in turn the need to reserve PCB space for circuitous wire routing of wires that would otherwise be too short.

FIG. 3 discloses a printed circuit board 300 with card-edge contacts on four edges of the printed circuit board and a module between the card-edge contacts. Printed circuit board 300 (sometimes referred to herein as "PCB 300") contains 4 sets of card-edge contacts: 302A, 302B, 304A, and 304B. Sets of card-edge contacts 302A and 302B (collectively, "302") are part of a first card-edge connector and sets of card-edge contacts 304A and 304B (collectively, "304") are part of a second card-edge connector.

Specifically, set of card-edge contacts 302A is on the top face of PCB 300 along edge 306 and set of card-edge contacts 302B is on the top face of PCB 300 along edge 308. Inserting edges 306 and 308 of PCB 300 into a corresponding socket (e.g., a coplanar card-edge connector socket) may cause the contacts within sets of contacts 302 to connect with corresponding contacts within the socket. Similarly, inserting edges 310 and 312 into another corresponding socket may cause the contacts within sets of contacts 304 to connect with corresponding contacts within the socket.

PCB 300 contains a module 314. Module 314 may be, for example, a microprocessor chip, memory chip, chipset, or another type of computer-chip module. Sets of contacts 302 partially surround module 314 because set of contacts 302A is located on a first edge of PCB 300 (edge 306) nearest a first edge of module 314 whereas set of contacts 302B is located on a second edge of PCB 300 (edge 308) nearest a second edge of module 314. Similarly, sets of contacts 304 also partially surround module 314 because set of contacts 304A and set of contacts 304B are similarly situated on edges 310 and 312.

Each set of contacts 302A, 302B, 304A, and 304B has a corresponding set of wire traces running from each contact to module 314. Specifically, set of contacts 302A has set of wire traces 316A, set of contacts 302B has set of wire traces 316B, set of contacts 304A has set of wire traces 318A, and set of contacts 304B has set of wire traces 318B. Of note, every trace in sets of wire traces 316A, 316B, 318A, and 318B, is, as illustrated, of equal length because the contacts in sets of contacts 302 and 304 surround module 314.

Because of this equal length, module 314 could, for example, communicate with the components of another PCB through the contacts in sets of card-edge contacts 302 without the negative design restrictions of (1) extending the length of a single edge of PCB 300 to provide sufficient length for all of the contacts in sets of card-edge contacts 302 and (2) extending the overall surface area of PCB 300 to enable circuitous wiring between sets of card-edge contacts 302 to avoid uneven timing. This may enable, for example, higher performance through the corresponding card-edge connection in a smaller connection system.

Of note, PCB 300 is illustrated as having a tapered shape. Specifically, while edges 306 and 308 intersect at a 90-degree corner and edges 310 and 312 do the same, the other two corners of PCB 300 are not present. This tapered shape may, for example, enable PCB 300 to interact with guide components in a corresponding socket, as is illustrated in FIGS. 4A and 4B. Further, this tapered shape may reduce the part cost of PCB 300 and enable PCB 300 to be installed within physically smaller environments.

Of additional note, PCB 300 is represented as containing two duplicate card-edge connectors for the sake of understanding. However, in some embodiments a similar PCB design may contain a single card-edge connector (e.g., sets of contacts 302) that partially surrounds module 314. Further, while the card-edge connectors associated with sets of contacts 302 and 304 are duplicates, as illustrated, in some embodiments a similar PCB may incorporate two or more different card-edge connectors. For example, a similar PCB may contain a module similar to module 314 and sets of contacts similar to sets of contacts 302, but along edges 310 and 312 the PCB may contain a card-edge connector with fewer traces or traces according to a different standard (e.g., peripheral component interconnect express). In some embodiments, one or both of sets of trace contacts 302 and 304 may be replaced with a card-edge socket which may be designed to accept a PCB card-edge connector.

Figure 4C:
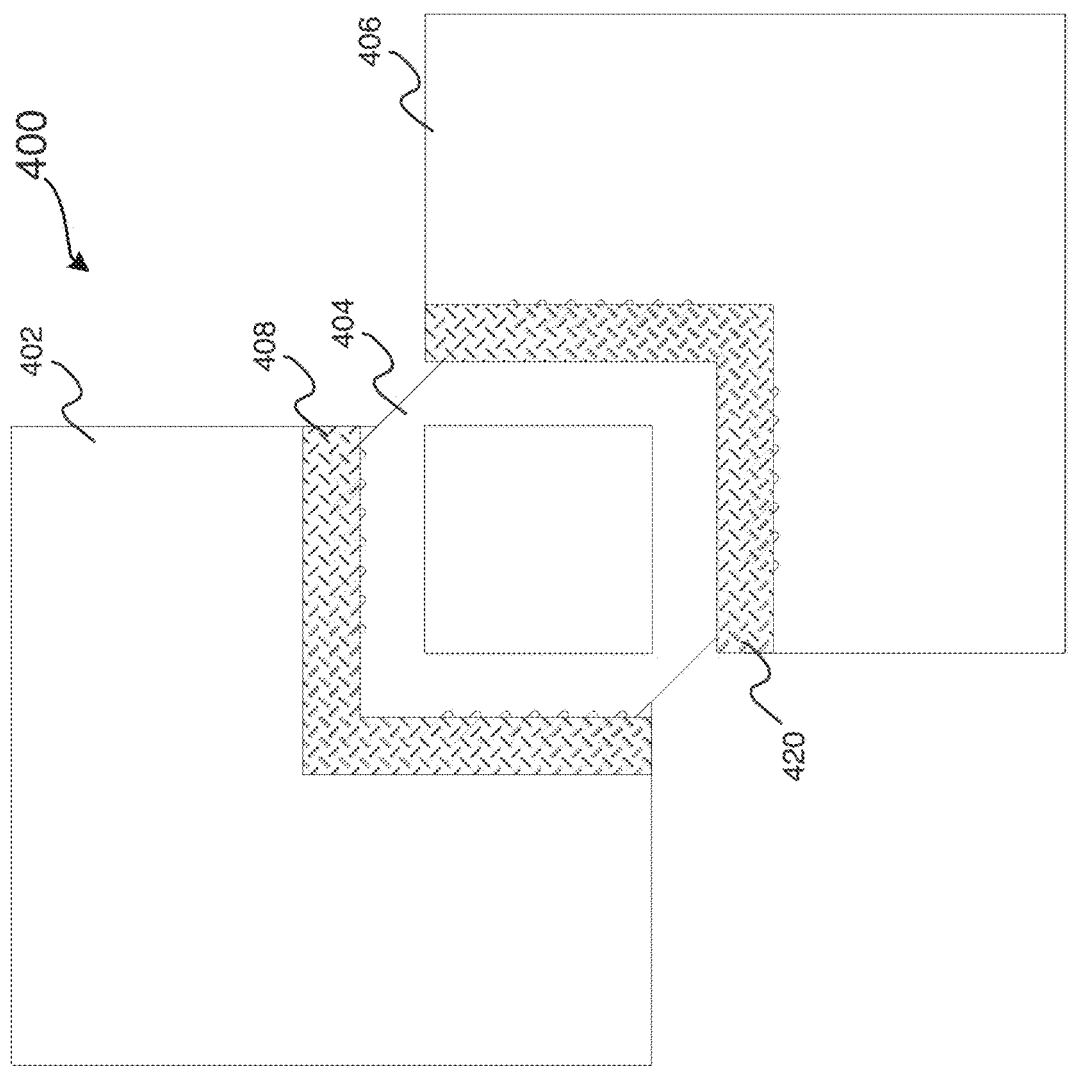
FIG. 4C discloses the connection system after a third printed circuit board is inserted into a coplanar card-edge socket on the first printed circuit board.

FIGS. 4A-4C illustrate a connection system 400 for a set of card edge connectors that can be used to connect three printed circuit boards 402, 404, and 406 together. PCBs 402-406 may represent various types of system components, but in an illustrative example PCB 402 may represent a backplane board with connection to a larger server system, PCB 404 may represent a daughterboard with a processor that can be added to the system (e.g., an add-in central processing unit, graphics processing unit, data processing unit, or application processing unit), and PCB 406 may represent a second daughterboard with resources needed for running the processor on PCB 404 (for example, a voltage-regulation module, a volatile memory module such as RAM; a non-volatile storage module; a module for a security sensor or IoT sensor; a module for a smart key for a security system).

PCB 402 includes a coplanar card-edge socket 408. Socket 408 is in a 90-degree form factor, meaning that has two sections that are offset from each other at an angle of 90 degrees: section 410, which interfaces with the top face of PCB 402 along a first edge of the PCB and section 412, which interfaces with the top face of PCB 402 along a second edge of the PCB. For this reason, Socket 408 is configured to interface with a card-edge connector that also have two edges that are offset from each other at an angle of 90 degrees. Of note, in some embodiments the sections 410 and 412 may actually be physically separate components that may or may not be physically secured to each other. In some embodiments, socket 408 may also have separate bottom sections that interface with a bottom face of PCB 402, in which case sections 410 and 412 may be considered "top sections." In some embodiments, sections 410 and 412 may be one continuous component, but may still be referred to as separate sections herein for the sake of understanding.

Socket 408 also contains alignment guides 414A and 414B. Alignment guides 414A and 414B (collectively "414") may be configured to interface with an edge connector on a tapered PCB (e.g., PCB 404) to encourage the edge connector to be inserted in the correct position in socket 408. In some embodiments, alignment guides may also assist in locking the PCB into place when the edge connector is fully inserted into socket 408.

PCB 404 contains an edge connector that is distributed along two edges of PCB 404. Specifically, the edge connector contains set of card-edge contacts 416A and set of card-edge contacts 416B (collectively "416"). Set of contacts 416A is configured to interface with a corresponding set of contacts within section 410 of socket 408, whereas set of contacts 416B is configured to interface with a corresponding set of contacts within section 412 of socket 408.

PCB 404 also contains circuit module 418. Circuit module 418 may be, for example, a processor that can be added to a system to which PCB 402 is connected. Circuit module 418 may be configured to pass signals through wire traces to the contacts within sets of contacts 416 and then to a card-edge connector socket into which PCB 404 is inserted.

PCB 404 also contains coplanar card-edge socket 420. Similar to socket 408, socket 420 is in a 90-degree form factor. However, the form factors of sockets 408 and 420 differ from the perspective of a connector being inserted into those connectors. Whereas socket 408 forms a concave opening, socket 420 forms a convex opening. In other words, from the perspective of a connector being inserted into socket 408, socket 408 forms an angle smaller than 180 degrees (i.e., 90 degrees). However, from the perspective of a connector being inserted into socket 420, socket 420 forms an angle larger than 180 degrees (i.e., 270 degrees).

PCB 406 contains sets of card-edge contacts 422A and 422B (collectively, "422"). Sets of contacts 422 form a card-edge connector with which PCB 406 can be connected to a card-edge socket (e.g., card-edge socket 420).

FIG. 4B illustrates connection system 400 after the card-edge connector on PCB 404 that is made up of sets of contacts 416 has been inserted into socket 408 on PCB 402. As illustrated, socket 408 is a coplanar socket, and thus PCBs 402 and 404 are now on the same plane. In other words, a top face of PCB 402 is on the same plane as a top face of PCB 404. In some embodiments, PCBs 402 and 404 may be on the same exact plane (for example, if the opening of socket 408 is the same width as the width of PCB 402), but in other embodiments the top faces of PCBs 402 and 404 may be on slightly different planes (for example, if the opening of socket 408 is slightly larger or slightly smaller than the width of PCB 402). In these embodiments, the majority of the widths (i.e., the thicknesses of) PCBs 402 and 404 are likely to overlap, and PCBs 402 and 404 are still be considered "coplanar" for the purpose of this disclosure. In typical embodiments, even when the top faces of PCBs 402 and 404 are on slightly different planes, the central layers of PCBs 402 and 404 may still be on the same exact plane.

FIG. 4C illustrates connection system 400 after the card-edge connector of PCB 406, which is made up of sets of contacts 422, has been inserted into socket 420 on PCB 402. Similar to socket 408, socket 420 is, as illustrated, a coplanar socket. Thus, PCBs 402, 404, and 406 are now all on the same plane as each other. As discussed with respect to FIG. 4B, the top faces of 402, 404, and 406 may still be on slightly different planes, the majority of the widths of PCBs 402, 404, and 406 are likely to overlap, and thus PCBs 402, 404, and 406 are still considered on the same plane (i.e., coplanar) for the purposes of this disclosure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A connection system for a card-edge connector, the connection system comprising:
    a printed circuit board comprising:
        a top face and a bottom face; and
        a first edge face that is normal to the top face and bottom face and a second edge face that is normal to the top face and bottom face;
        wherein the first edge face and second edge face intersect at an angle that is not a straight angle;
    a coplanar card-edge socket on the printed circuit board, the socket comprising:
        a top section that interfaces with the top face of the printed circuit board along the first and second edge faces of the printed circuit board; and
        a bottom section that interfaces with the bottom face of the printed circuit board along the first and second edge faces of the printed circuit board.

2. The connection system of claim 1, wherein the first edge face and the second edge face intersect at a 90-degree angle.

3. The connection system of claim 1, wherein the coplanar card-edge socket comprises an alignment tab.

4. A printed circuit board comprising:
    a top face and a bottom face;
    a first edge face that is normal to the top face and bottom face and a second edge face that is normal to the top face and bottom face, wherein the first edge face and second edge face intersect at an angle that is not a straight angle;
    a first set of card-edge contacts on the top face along the first edge face;
    a second set of card-edge contacts on the top face along the second edge face;
    a circuit-chip module mounted to the top face of the printed circuit board;
    wherein the circuit-chip module is partially surrounded by the first set of card-edge contacts and the second set of card-edge contacts;
    a third edge face that is normal to the top face and bottom face;
    a fourth edge face that is normal to the top face and bottom face, wherein the third edge face and fourth edge face intersect at an angle that is not a straight angle;
    a third set of card-edge contacts on the top face along the third edge face; and
    a fourth set of card-edge contacts on the top face along the fourth edge face.

5. The printed circuit board of claim 4, wherein the first edge face and the second edge face intersect at a 90-degree angle.

6. The printed circuit board of claim 4, wherein the circuit-chip module is a microprocessor chip.

7. The printed circuit board of claim 4, further comprising an alignment cutout.

8. The printed circuit board of claim 4, wherein the printed circuit board has a tapered shape.

9. The printed circuit board of claim 4, further comprising:
    a coplanar card-edge socket on the printed circuit board, the socket comprising:
        a top section that interfaces with the top face of the printed circuit board along the third and fourth edge faces of the printed circuit board; and
        a bottom section that interfaces with the bottom face of the printed circuit board along the third and fourth edge faces of the printed circuit board.

10. A connection system for a card-edge connector, the connection system comprising:
- a first printed circuit board comprising:
  - a first top face and a first bottom face; and
  - a first edge that is normal to the first top face and first bottom face and a second edge that is normal to the first top face and first bottom face;
  - wherein the first edge and second edge intersect at a first angle that is not a straight angle;
- a second printed circuit board comprising:
  - a second top face and a second bottom face;
  - a third edge that is normal to the second top face and second bottom face and a fourth edge that is normal to the second top face and second bottom face,
    - wherein the third edge and fourth edge intersect at a second angle that is supplementary to the first angle; and
  - a first set of card-edge contacts on the second top face along the third edge; and
- a coplanar card-edge socket on the first printed circuit board, the socket comprising:
  - a top section that interfaces with the first top face of the first printed circuit board along the first and second edges of the first printed circuit board; and
  - a bottom section that interfaces with the first bottom face of the first printed circuit board along the first and second edges of the first printed circuit board;
- wherein inserting the third and fourth edges of the second printed circuit board into the coplanar card-edge socket causes the first printed circuit board to be on the same plane as the second printed circuit board.

11. The connection system of claim 10, wherein the first and second edge intersect at an obtuse angle.

12. The connection system of claim 10, wherein the first and second edge intersect at an acute angle.

13. The connection system of claim 10, wherein the second printed circuit board comprises a non-volatile storage module.

14. The connection system of claim 10, wherein the second printed circuit board comprises an alignment cutout.

15. The connection system of claim 10, wherein the second printed circuit board has a tapered shape.

16. The connection system of claim 10, wherein the second printed circuit board comprises:
- a fifth edge that is normal to the second top face and second bottom face;
- a sixth edge that is normal to the second top face and second bottom face; and
- a second set of card-edge contacts on the second top face along the fifth edge.

17. The connection system of claim 10, wherein the second printed circuit board comprises:
- a fifth edge that is normal to the second top face and second bottom face;
- a sixth edge that is normal to the second top face and second bottom face; and
- a coplanar card-edge socket on the second printed circuit board, the socket comprising:
  - a top section that interfaces with the second top face of the second printed circuit board along the fifth and sixth edges of the second printed circuit board; and
  - a bottom section that interfaces with the second bottom face of the second printed circuit board along the fifth and sixth edges of the first printed circuit board.

18. The connection system of claim 10, further comprising a third printed circuit board, wherein the third printed circuit board comprises a card-edge connector that interfaces with a corresponding card-edge connector on the second printed circuit board.

* * * * *